(12) United States Patent
Lee

(10) Patent No.: US 6,229,183 B1
(45) Date of Patent: May 8, 2001

(54) ESD DAMAGE IMMUNITY BUFFER

(75) Inventor: Shu-Chuan Lee, Changhua (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/460,590

(22) Filed: Dec. 14, 1999

(30) Foreign Application Priority Data

Oct. 4, 1999 (TW) .................................................. 88117045

(51) Int. Cl.[7] ........................... H01L 23/62; H01L 29/74; H01L 31/111
(52) U.S. Cl. .......................... 257/360; 257/173; 257/359; 257/363
(58) Field of Search ..................................... 257/173, 174, 257/355, 356, 357, 358, 359, 360, 363

(56) References Cited

U.S. PATENT DOCUMENTS

| | | | |
|---|---|---|---|
| 3,590,340 | * | 6/1971 | Kubo et al. . |
| 5,430,602 | * | 7/1995 | Chin et al. ............................. 361/212 |
| 5,440,151 | * | 8/1995 | Crevel et al. ......................... 257/173 |
| 5,440,162 | * | 8/1995 | Worley et al. ........................ 257/355 |
| 5,449,939 | * | 9/1995 | Horiguchi et al. ................... 257/360 |
| 5,623,387 | * | 4/1997 | Li et al. .................................. 361/56 |
| 5,814,865 | * | 9/1998 | Duvvury et al. ...................... 257/360 |
| 5,850,094 | * | 12/1998 | Kato et al. ............................. 257/355 |
| 6,054,736 | * | 4/2000 | Shigehara et al. .................... 257/336 |

* cited by examiner

Primary Examiner—Ngân V. Ngô
(74) Attorney, Agent, or Firm—Fish & Richardson P.C.

(57) ABSTRACT

The present invention discloses an ESD damage immunity buffer, comprising: a gate, a first doped region, a second doped region, a third doped region, and a resist layer. The ESD damage immunity buffer, which is in parallel with an ESD protection circuit, is connected to a pad and the circuit grounding node. The gate is formed on the semiconductor substrate, and the first doped region and the second doped region are formed adjacent to the region below the gate in the semiconductor substrate and electrically coupled to the ground. The third doped region is formed in the semiconductor substrate and electrically coupled to the pad. Further, a resist layer is formed upon the semiconductor substrate and connects the third doped region to the second doped region, wherein said resist layer ensures a triggering of the ESD protection circuit prior to the ESD damage immunity buffer during an ESD event.

5 Claims, 2 Drawing Sheets

ESD DAMAGE IMMUNITY BUFFER

BACKGROUND OF THE INVENTION

1. Field of the Invention

The present invention relates to an integrated circuit (IC) protection technique. More particularly, the present invention relates to an electrostatic discharge immunity buffer that ensures the triggering of an ESD protection circuit prior to the buffer during an ESD event.

2. Description of the Prior Art

CMOS (Complementary Metal Oxide Semiconductor) transistors are used to increase the working speed of integrated circiuts (ICs). CMOS transistors also enhance IC performance and lower the cost of each chip. In order to reduce the hot carrier effect, MOS devices have LDD structures (Lightly Doped Drain). Additionally, a "salicide" process has been developed to reduce a spreading resistance between a source or a drain and a gate. However, these processes can lead to undesired results; namely, ICs can be damaged by electrostatic discharge (ESD), making reliability a concern. ESD influences the performance of ICs in measurement, fabrication, and use. Therefore, protecting ICs from ESD damage is extremely important.

As the size of ICs decreases, the ability to protect them from ESD damage becomes more difficult. One solution is an ESD-implant process. As applied in the CMOS process, two MOS devices are formed, wherein one MOS device has LDD structures, while the other doesn't. The MOS device having LDD structures is used in an internal circuit, and the other one is used for input/output (I/O). However, the junction between a source and a drain region of the MOS device that doesn't have LDD structures and a substrate is deeper. This will cause ions in the source or the drain regions to diffuse laterally. Thus, the channel length of the MOS device must be long so as to provide adequate protection from ESD damage.

In addition, a silicided-diffusion blocking process has also been proposed to protect MOS devices from the damage caused by ESD. This process removes the silicided diffusion regions in the source and the drain regions of a MOS device so that the sheet resistance is increased. Thus, the peak current during the ESD event is limited. This results in better protection to MOS devices.

Additionally, combining the silicided-diffusion blocking process and the ESD-implant process can effectively increase the protection of CMOS ICs from damage due to ESD.

However, an additional ESD-implant mask is added in the ESD-implant process described above. The number of steps in the process and the cost are therefore increased. Further, the ESD-implant process is complex, and the salicide processing may pollute the environment. This leads to low production yield.

SUMMARY OF THE INVENTION

Accordingly, the object of the present invention is to provide an ESD damage immunity buffer offering improved protection to CMOS ICs from damage caused by an ESD event.

To achieve the above-mentioned object of the invention, the present invention provides an ESD damage immunity buffer formed upon a semiconductor substrate, comprising: a gate, a first doped region, a second doped region, a third doped region, and a resist layer. The ESD damage immunity buffer, which is in parallel with an ESD protection circuit, is connected to a pad and the circuit grounding node. The gate is formed on the semiconductor substrate, and the first doped region and the second doped region are formed adjacent to the region below the gate in the semiconductor substrate and electrically coupled to the ground. The third doped region is formed in the semiconductor substrate and electrically coupled to the pad. Further, a resist layer is formed upon the semiconductor substrate and connects the third doped region to the second doped region, wherein said resist layer ensures a triggering of the ESD protection circuit prior to the ESD damage immunity buffer during an ESD event.

It is noted that the resist layer between the third doped region and the second doped region provides resistance against current flowing through the buffer. In other words, the ESD stress is released by an ESD protection circuit so that the internal circuit is protected.

Additionally, the ESD damage immunity buffer isn't destroyed by the "salicide" process. Moreover, the ESD damage immunity buffer is formed by layout, therefore the processes aren't as complex as those of the prior art. There is no increase in cost, either.

According to an example of the present invention, the resist layer connecting the second doped region to the third doped region is a well region in the semiconductor substrate.

According to the other example of the present invention, the resist layer connecting the second doped region to the third doped region is a polysilicon layer in the semiconductor substrate.

According to another example of the present invention, the resist layer connecting the second doped region to the third doped region is a barrier layer in the semiconductor substrate.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
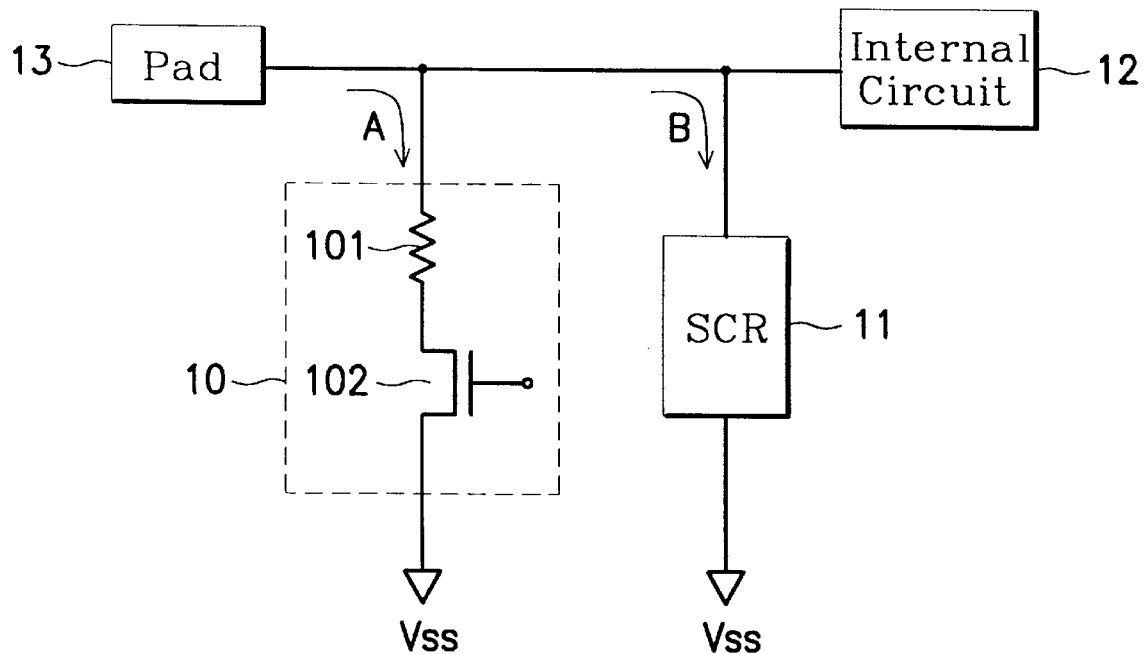
FIG. 1 shows an ESD protection circuit.

Referring to FIG. 1, in which an ESD protection circuit is shown, mark 10 represents an ESD damage immunity buffer connected to a pad 13 in accordance with the present invention. The buffer 10 is composed of a resistor 101 and a NMOS transistor 102. The silicon-controlled rectifier 11 (SCR hereinafter) is arranged at the pad 13, which is connected to an internal circuit 12. When ESD stress occurs at the pad 13, ESD current is conducted through path A and path B. This protects the internal circuit 12 from ESD damage. Furthermore, the resistor 101 in the ESD immunity damage buffer 10 offers resistance against current flowing along the path A. ESD current is conducted along the path B, therefore SCR 11 bypasses the ESD stress. It is noted that the SCR 11 is easily turned on to sustain the ESD current. Therefore, the SCR 11 provides complete protection against ESD.

EXAMPLE 1

Figure 2:
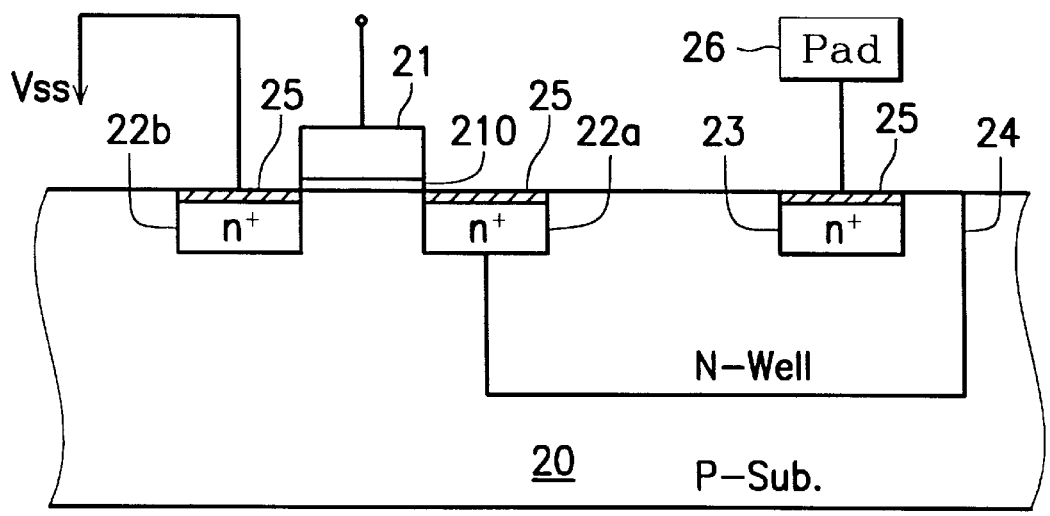
FIG. 2 shows a first example of ESD damage immunity buffer according to the present invention.

Please refer to FIG. 2, wherein an ESD immunity damage buffer fabricated onto a semiconductor substrate is schematically depicted in a cross-sectional view. As shown in FIG. 2, the ESD immunity damage buffer is fabricated on a P-type silicon substrate 20 in which an N-well region 24 is formed. A gate 21 is formed upon a gate oxide 210 covering the P-type silicon substrate 20. In the P-type silicon substrate 20 adjacent to the region below the gate 21, a drain region 22a and a source region 22b are formed by means of doping with ions of a N-type conductivity, for example, Arsenic ions. An $N^+$-type doped region 23 is formed in the N-well region 24 connected to a pad 26. It is noted that the drain region 22a is formed in the silicon substrate 20 adjacent to the N-well region 24 to form the resistor 101 shown in FIG. 1.

Upon the surface of the silicon substrate 20 where the drain region 22a, the source region 22b, and the $N^+$-type doped region 23 are formed, a salicide layer 25 is formed. Referring to FIG. 1 and FIG. 2, when ESD stress occurs at the pad 13 in FIG. 1 (pad 26 in FIG. 2), the N-well 24 offers resistance against ESD current so that the ESD current flows into the SCR 11. Therefore, the internal circuit 12 is protected by the SCR 11, and ESD current won't destroy the internal circuit 12.

EXAMPLE 2

Figure 3:
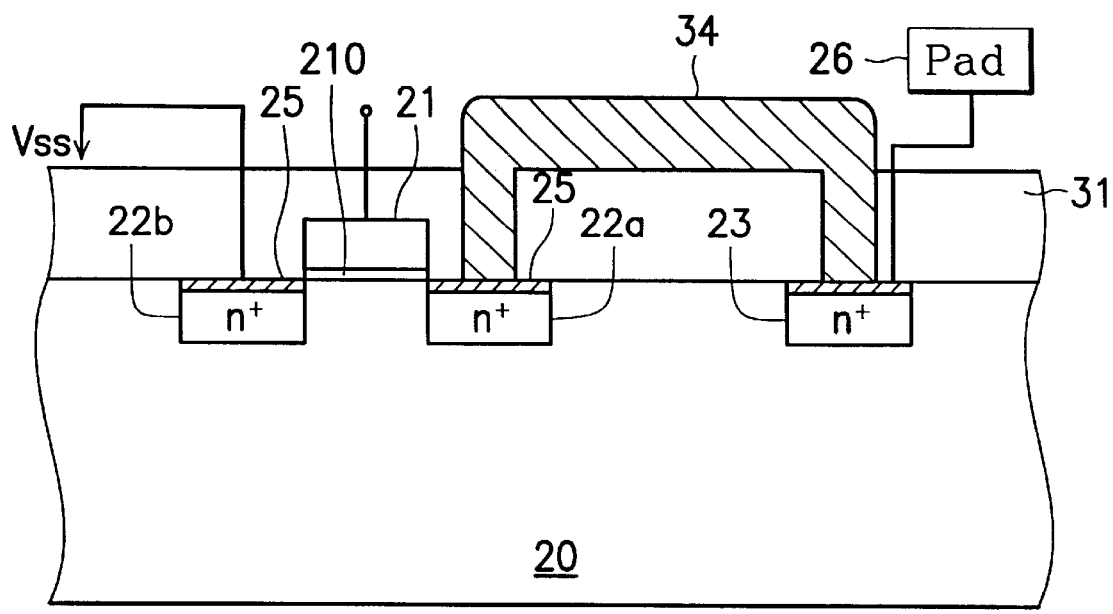
FIG. 3 shows a second example of ESD damage immunity buffer according to the present invention.

Referring to FIG. 3, an ESD immunity damage buffer fabricated onto a semiconductor substrate is schematically depicted in a cross-sectional view. For convenience, elements in FIG. 3 which are the same as those in FIG. 2 are marked the same. As shown in FIG. 3, an insulating layer, for example, a silicon dioxide layer 31 is formed above the silicon substrate 20. A polysilicon layer 34 is formed upon the silicon dioxide layer 31 after photolithography and etching processes. The polysilicon layer 34 connects the $N^+$-type doped region 23 to the drain region 22a to form the resistor 101 shown in FIG. 1.

Please refer to FIG. 1 and FIG. 3. When ESD stress occurs at the pad 13 in FIG. 1 (pad 26 in FIG. 3), the polysilicon layer 34 offers resistance against ESD current so that the ESD current flows into the SCR 11. Accordingly, the internal circuit 12 is protected by the SCR 11, and ESD current won't destroy the internal circuit 12.

EXAMPLE 3

Figure 4:
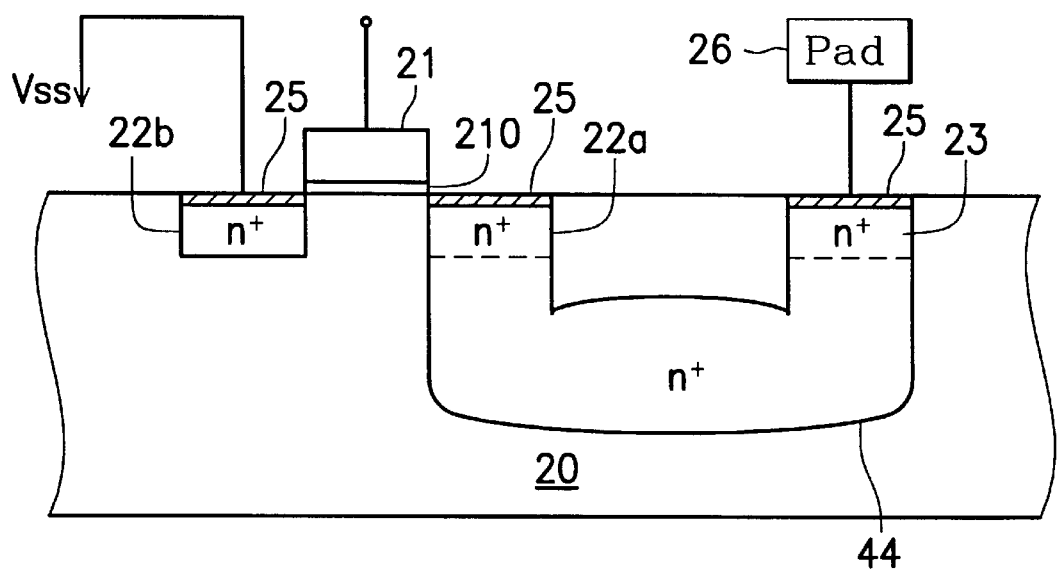
FIG. 4 shows a third example of ESD damage immunity buffer according to the present invention.

Refer now to FIG. 4, where an ESD immunity damage buffer fabricated onto a semiconductor substrate is schematically depicted in a cross-sectional view. For convenience, elements in FIG. 4 which are the same as those in FIG. 2 are marked the same. As shown in FIG. 4, a barrier layer 44 doped with $N^+$-type ions is formed in the silicon substrate 20. The barrier layer 44 connects the drain region 22a to the $N^+$-type doped region 23 to form the resistor 101 in FIG. 1.

Please refer to FIG. 1 and FIG. 4, when ESD stress occurs at the pad 13 in FIG. 1 (pad 26 in FIG. 4), the barrier layer 44 offers resistance against ESD current so that the ESD current flows into the SCR 11. Accordingly, the internal circuit 12 is protected by the SCR 11, and the internal circuit 12 won't be damaged.

According to the present invention, each of the three examples ensures the triggering of an ESD protection circuit prior to the ESD immunity damage buffer during an ESD event. Furthermore: (1) the ESD immunity damage buffer is formed by layout, therefore the processes aren't as complex as those of the prior art; (2) the cost doesn't increase; (3)the internal circuit can be protected effectively.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD damage immunity disposed in parallel with an ESD protection circuit onto a semiconductor substrate, said ESD damage immunity buffer being placed between a pad and ground, comprising:

a gate formed on the semiconductor substrate;

a first doped region formed below one side of the gate in the semiconductor substrate and electrically coupled to the ground;

a second doped region formed below the other side of the gate in the semiconductor substrate;

a third doped region formed in the semiconductor substrate and electrically coupled to the pad; and a resist layer in the form of a polysilicon layer, formed upon the semiconductor substrate and connecting the third doped region to the second doped region, said resist layer ensuring a triggering of the ESD protection circuit prior to the ESD damage immunity buffer during an ESD event.

2. The device as claimed in claim 1, wherein the resist layer is formed on a silicon dioxide layer covering the semiconductor substrate.

3. The device as claimed in claim 1, wherein the surfaces of the first, the second, and the third doped regions are covered with salicide.

4. The device as claimed in claim 1, wherein the semiconductor substrate is a silicon substrate.

5. The device as claimed in claim 1, wherein the gate is formed on a gate oxide covering the semiconductor substrate.

* * * * *